US009653156B2

(12) United States Patent
Shirakawa et al.

(10) Patent No.: US 9,653,156 B2
(45) Date of Patent: May 16, 2017

(54) MEMORY CONTROLLER, NONVOLATILE SEMICONDUCTOR MEMORY DEVICE AND MEMORY SYSTEM

(71) Applicant: KABUSHIKI KAISHA TOSHIBA, Minato-ku (JP)

(72) Inventors: Masanobu Shirakawa, Chigasaki (JP); Tsuyoshi Atsumi, Tokyo (JP); Hidetaka Tsuji, Yokohama (JP); Tomoyuki Kantani, Yokohama (JP); Hideaki Yamamoto, Yokosuka (JP); Yasuhiko Kurosawa, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/712,017

(22) Filed: May 14, 2015

(65) Prior Publication Data

US 2016/0247561 A1     Aug. 25, 2016

Related U.S. Application Data

(60) Provisional application No. 62/118,831, filed on Feb. 20, 2015.

(51) Int. Cl.
*G11C 11/56* (2006.01)
*G11C 7/04* (2006.01)

(52) U.S. Cl.
CPC ............ *G11C 11/5642* (2013.01); *G11C 7/04* (2013.01)

(58) Field of Classification Search
CPC .............................. G11C 11/5642; G11C 7/04
USPC ........................... 365/185.03, 185.11, 185.08
See application file for complete search history.

(56) References Cited

U.S. PATENT DOCUMENTS

| 6,205,074 B1 * | 3/2001 | Van Buskirk | G11C 5/145 365/185.22 |
| 6,870,766 B2 * | 3/2005 | Cho | G11C 7/04 365/185.03 |
| 7,057,958 B2 * | 6/2006 | So | G11C 5/143 365/189.07 |

(Continued)

FOREIGN PATENT DOCUMENTS

| JP | 2010-537360 A | 12/2010 |
| JP | 2012-503269 A | 2/2012 |

(Continued)

*Primary Examiner* — Vu Le
*Assistant Examiner* — Sung Cho
(74) *Attorney, Agent, or Firm* — Oblon, McClelland, Maier & Neustadt, L.L.P.

(57) ABSTRACT

According to one embodiment, a memory system includes a nonvolatile semiconductor memory and a memory controller. The memory controller has a first signal generation section that generates a first signal related with a read voltage used for read operation of the nonvolatile semiconductor memory, a second signal generation section that generates a second signal that specifies the temperature coefficient used for the correction for temperature of the read voltage, and a first interface section that outputs the first signal, the second signal and a read command. The nonvolatile semiconductor memory has a word line, a memory cell array includes memory cells connected to the word line, and a second interface section that receives the first signal, the second signal and the read command.

10 Claims, 13 Drawing Sheets

(56) References Cited

U.S. PATENT DOCUMENTS

| | | | | |
|---|---|---|---|---|
| 7,245,536 B1 * | 7/2007 | Poenaru | G11C 16/30 | 365/185.2 |
| 7,269,092 B1 * | 9/2007 | Miwa | G11C 5/147 | 365/189.09 |
| 7,277,355 B2 * | 10/2007 | Tanzawa | G11C 5/14 | 365/185.03 |
| 7,447,807 B1 * | 11/2008 | Merry | G06F 3/0604 | 710/36 |
| 7,755,946 B2 * | 7/2010 | Dunga | G11C 7/04 | 365/185.03 |
| 8,081,508 B2 * | 12/2011 | Kim | G11C 5/143 | 365/185.03 |
| 8,213,255 B2 * | 7/2012 | Hemink | G11C 7/04 | 365/185.18 |
| 8,472,274 B2 * | 6/2013 | Fai | G11C 11/5642 | 365/185.09 |
| 8,576,651 B2 * | 11/2013 | Scheuerlein | G11C 7/04 | 365/185.18 |
| 8,659,966 B2 | 2/2014 | Choi et al. | | |
| 8,717,824 B2 | 5/2014 | Sutardja | | |
| 9,001,579 B2 * | 4/2015 | Song | G11C 7/04 | 365/185.03 |
| 9,042,175 B2 * | 5/2015 | Sim | G11C 16/26 | 365/185.03 |
| 9,275,741 B1 * | 3/2016 | Liang | G11C 16/10 | |
| 2004/0062085 A1 * | 4/2004 | Wang | G11C 5/147 | 365/233.14 |
| 2006/0250159 A1 * | 11/2006 | Lin | H03K 3/03 | 326/93 |
| 2007/0247957 A1 * | 10/2007 | Miwa | G11C 8/08 | 365/230.06 |
| 2007/0291567 A1 * | 12/2007 | Mokhlesi | G11C 7/04 | 365/212 |
| 2008/0158975 A1 * | 7/2008 | Sekar | G11C 7/04 | 365/185.18 |
| 2010/0073069 A1 * | 3/2010 | Wang | G11C 5/143 | 327/513 |
| 2013/0163342 A1 * | 6/2013 | Dutta | G11C 16/26 | 365/185.21 |
| 2014/0059405 A1 * | 2/2014 | Syu | G11C 16/349 | 714/773 |

FOREIGN PATENT DOCUMENTS

| | | |
|---|---|---|
| JP | 2012-113810 A | 6/2012 |
| JP | 5252665 B2 | 7/2013 |
| JP | 5444355 B2 | 3/2014 |

* cited by examiner

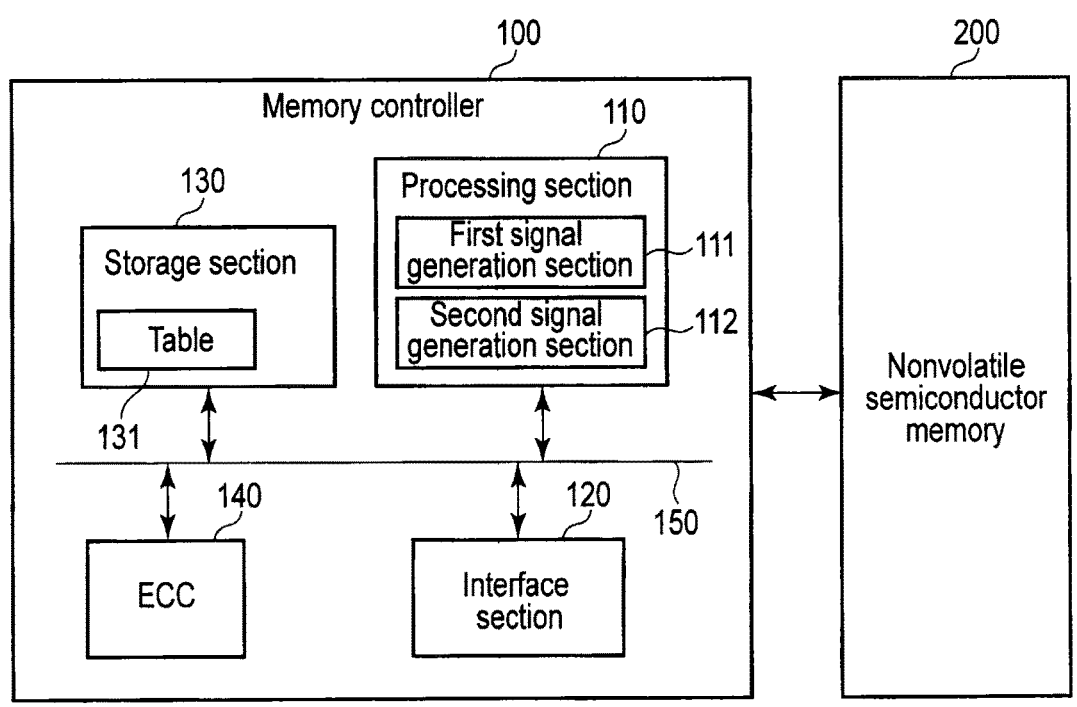
F I G. 1

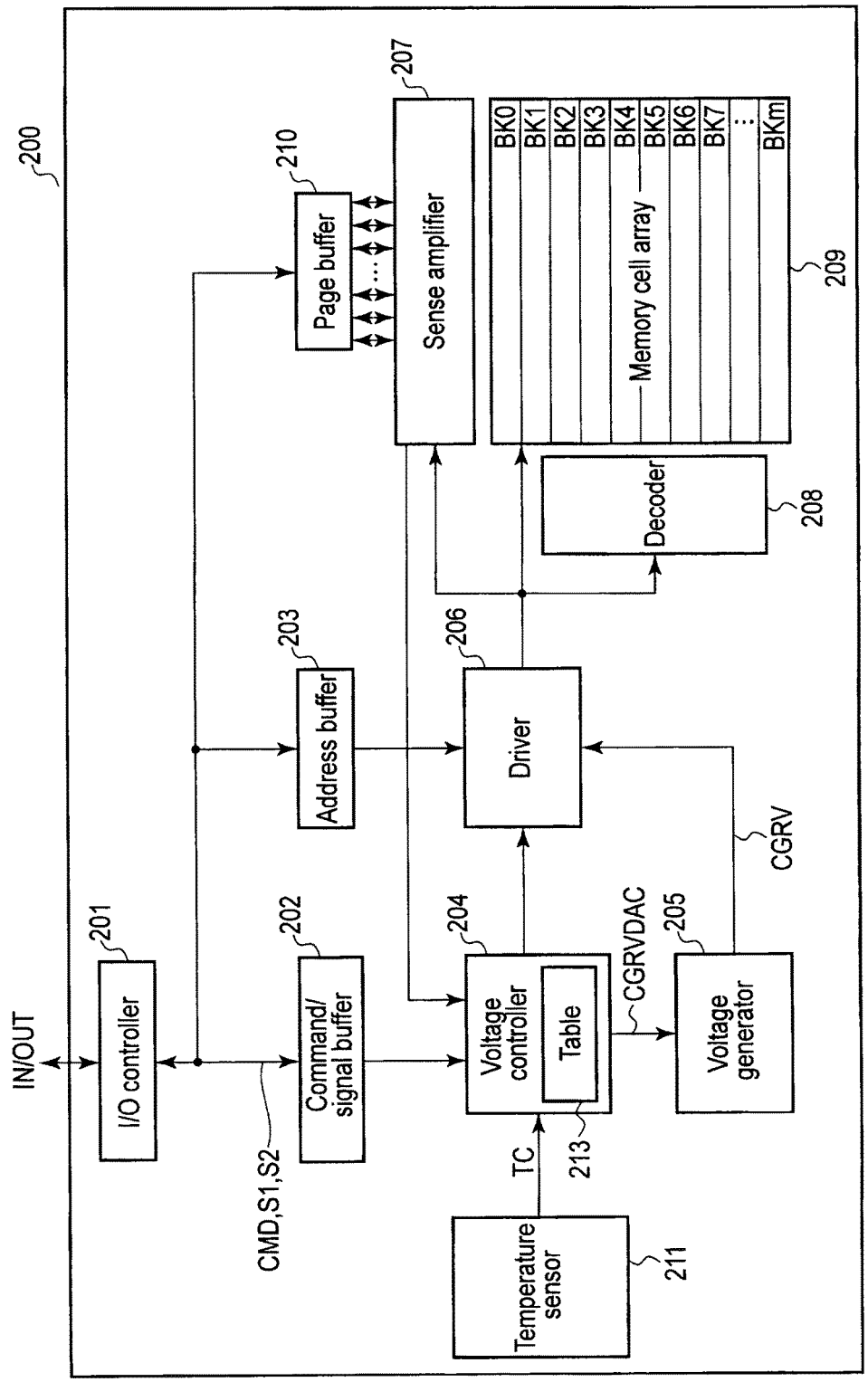
F I G. 2

| Table 131 |||||
|---|---|---|---|---|
| Digital valve | Internal operation | A-level cell | B-level cell | C-level cell |
| D0(0000000) |  | 1 | 0 | 0 |
| D1(0000001) |  | 1 | 0 | 0 |
| ⋮ |  | ⋮ | ⋮ | ⋮ |
| D55(0110111) | AR | 1 | 0 | 0 |
| D59(0111011) | AV | 1 | 0 | 0 |
| ⋮ |  | ⋮ | ⋮ | ⋮ |
| D69(1000101) |  | 1 | 0 | 0 |
| D70(1000110) |  | 0 | 1 | 0 |
| ⋮ |  | ⋮ | ⋮ | ⋮ |
| D85(1010101) | BR | 0 | 1 | 0 |
| D89(1011001) | BV | 0 | 1 | 0 |
| ⋮ |  | ⋮ | ⋮ | ⋮ |
| D99(1100011) |  | 0 | 1 | 0 |
| D100(1100100) |  | 0 | 0 | 1 |
| ⋮ |  | ⋮ | ⋮ | ⋮ |
| D115(1110011) | CR | 0 | 0 | 1 |
| ⋮ |  | ⋮ | ⋮ | ⋮ |
| D119(1110111) | CV | 0 | 0 | 1 |
| ⋮ |  | ⋮ | ⋮ | ⋮ |
| D127(1111111) |  | 0 | 0 | 1 |

F I G. 4

| Table 131 | | | | |
|---|---|---|---|---|
| Digital valve | Internal operation | A-level cell | B-level cell | C-level cell |
| D0(0000000) | | 1 | 0 | 0 |
| D1(0000001) | | 1 | 0 | 0 |
| ⋮ | | ⋮ | ⋮ | ⋮ |
| D54(0110110) | | 1 | 0 | 0 |
| D55(0110111) | AR | 1 | 0 | 0 |
| ⋮ | | ⋮ | ⋮ | ⋮ |
| D59(0111011) | AV | 1 | 0 | 0 |
| ⋮ | | ⋮ | ⋮ | ⋮ |
| D84(1010100) | | 1 | 0 | 0 |
| D85(1010101) | BR | 0 | 1 | 0 |
| ⋮ | | ⋮ | ⋮ | ⋮ |
| D89(1011001) | BV | 0 | 1 | 0 |
| ⋮ | | ⋮ | ⋮ | ⋮ |
| D114(1110010) | | 0 | 1 | 0 |
| D115(1110011) | CR | 0 | 0 | 1 |
| ⋮ | | ⋮ | ⋮ | ⋮ |
| D119(1110111) | CV | 0 | 0 | 1 |
| ⋮ | | ⋮ | ⋮ | ⋮ |
| D127(1111111) | | 0 | 0 | 1 |

FIG. 5

| Table 213 | | | |
|---|---|---|---|
| Digital valve | Read voltage CGRV | Internal operation | Temperature coefficient |
| D55(0110111) | V55 | AR | TCO_A |
| D59(0111011) | V59 | AV | TCO_A |
| D85(1010101) | V85 | BR | TCO_B |
| D89(1011001) | V89 | BV | TCO_B |
| D115(1110011) | V115 | CR | TCO_C |
| D119(1110111) | V119 | CV | TCO_C |

FIG. 6

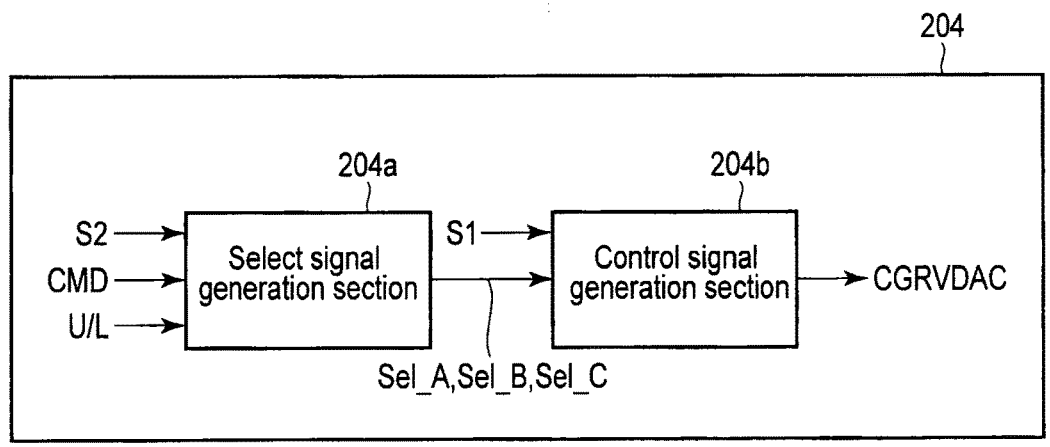
F I G. 7
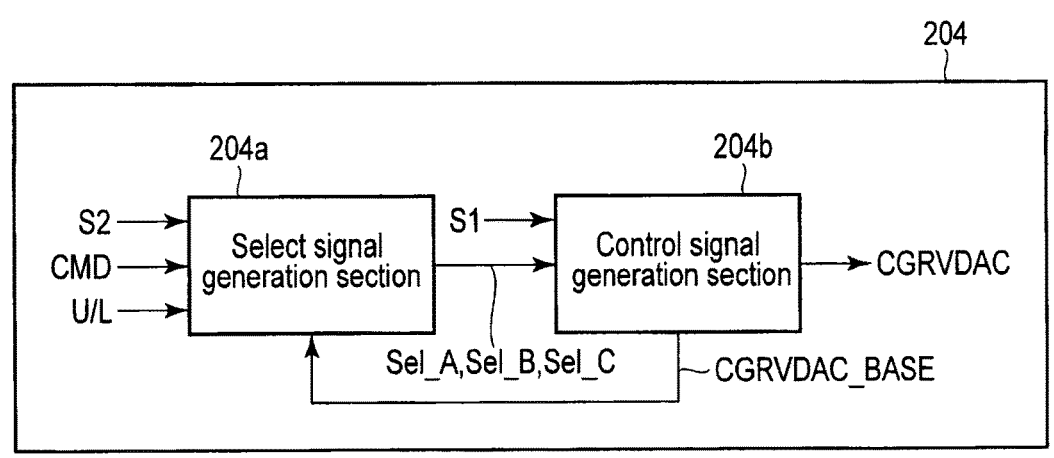
F I G. 8

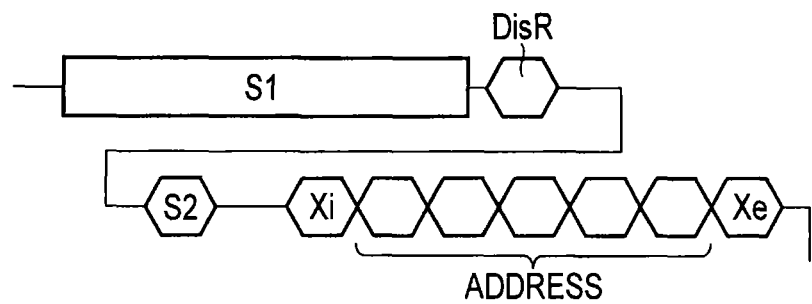
F I G. 10
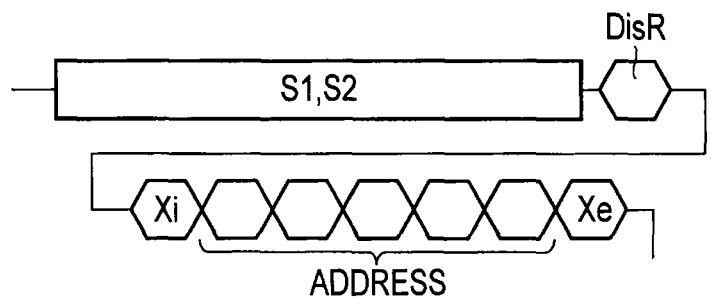
F I G. 11

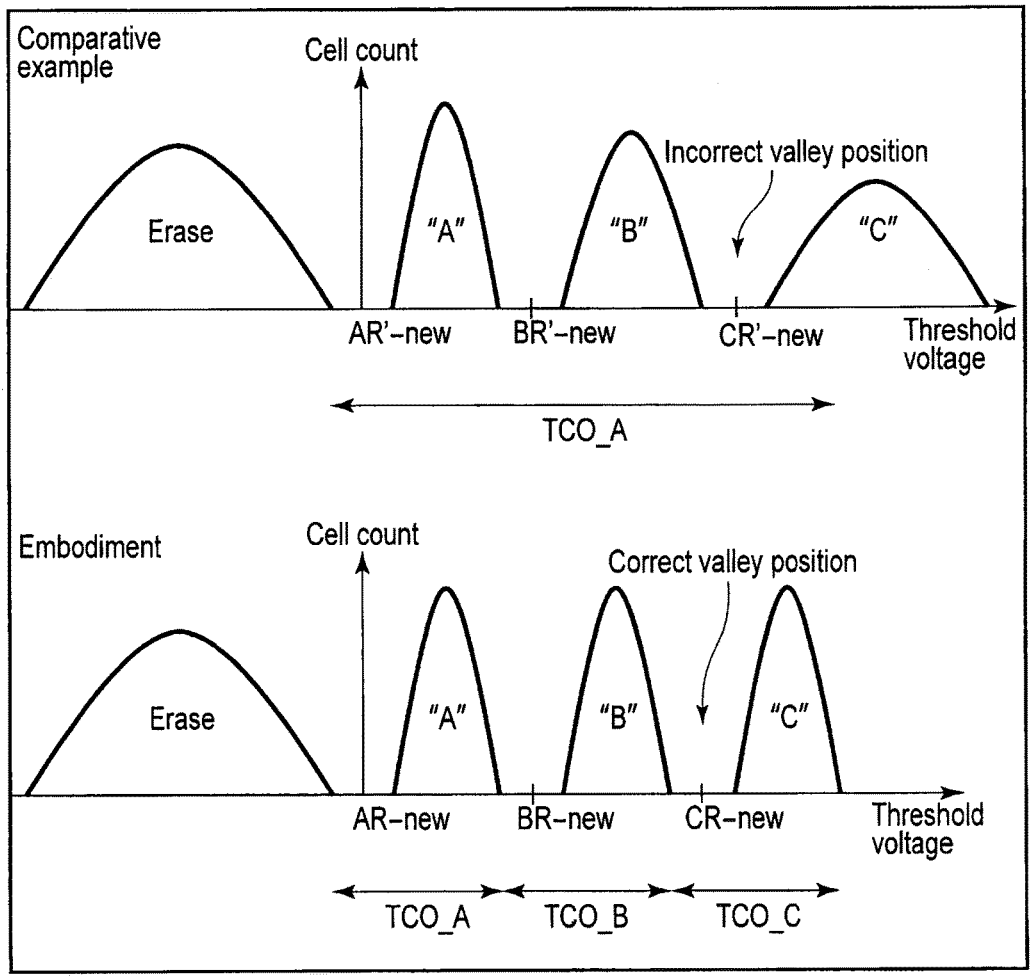
F I G. 14
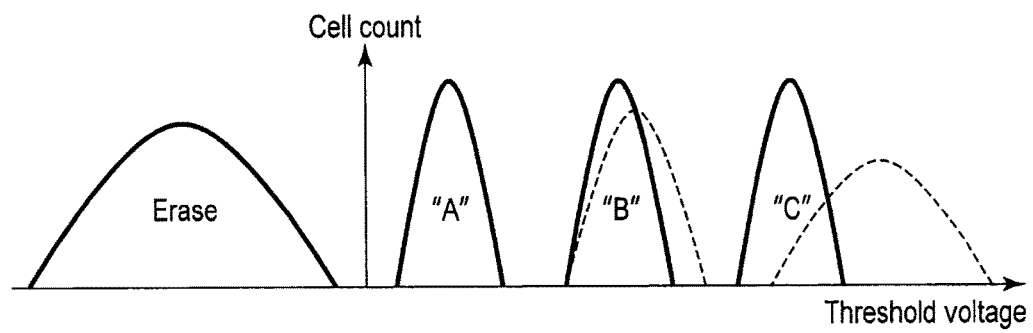
F I G. 15

MEMORY CONTROLLER, NONVOLATILE SEMICONDUCTOR MEMORY DEVICE AND MEMORY SYSTEM

CROSS-REFERENCE TO RELATED APPLICATIONS

This application claims the benefit of U.S. Provisional Application No. 62/118,831, filed Feb. 20, 2015, the entire contents of which are incorporated herein by reference.

FIELD

Embodiments described herein relate generally to a memory controller, a nonvolatile semiconductor memory device and a memory system.

BACKGROUND

It is known in the field of multi-value nonvolatile semiconductor memory that memory cells have their respective temperature dependencies which are different according to their respective thresholds. Therefore, in a normal read, the read voltages used to determine the respective thresholds of all the memory cells are individually adjusted based on different temperature coefficients suitable for the respective memory cells. On the other hand, a distribution read is performed to ascertain the threshold distribution state exhibited by all the memory cells, i.e., to ascertain the shape of a mountain or a valley, etc., for every one of the thresholds of all the memory cells. However, in the distribution read, the read voltages used to determine the respective thresholds of all the memory cells are adjusted based on a single common (the same) temperature coefficient irrespective of difference in read voltage. Accordingly, the threshold distribution detected by the distribution read may not be in agreement with the threshold distribution actually exhibited at the normal read.

BRIEF DESCRIPTION OF THE DRAWINGS

FIG. 1 is a view illustrating an exemplary memory system;

FIG. 2 is a view illustrating an exemplary volatile semiconductor memory;

FIG. 4 and FIG. 5 are views, each illustrating an exemplary table which a memory controller has;

FIG. 6 is a view illustrating an exemplary table which a nonvolatile semiconductor memory has;

FIG. 7 and FIG. 8 are views, each illustrating an exemplary voltage controller;

FIG. 10 and FIG. 11 are views, each illustrating an example of changing a temperature coefficient;

FIG. 14 is a view contrastively illustrating a comparative example and an embodiment;

FIG. 15 is a view illustrating discrepancy between the actual threshold distribution and the threshold distribution detected by distribution read;

DETAILED DESCRIPTION

Figure 3:
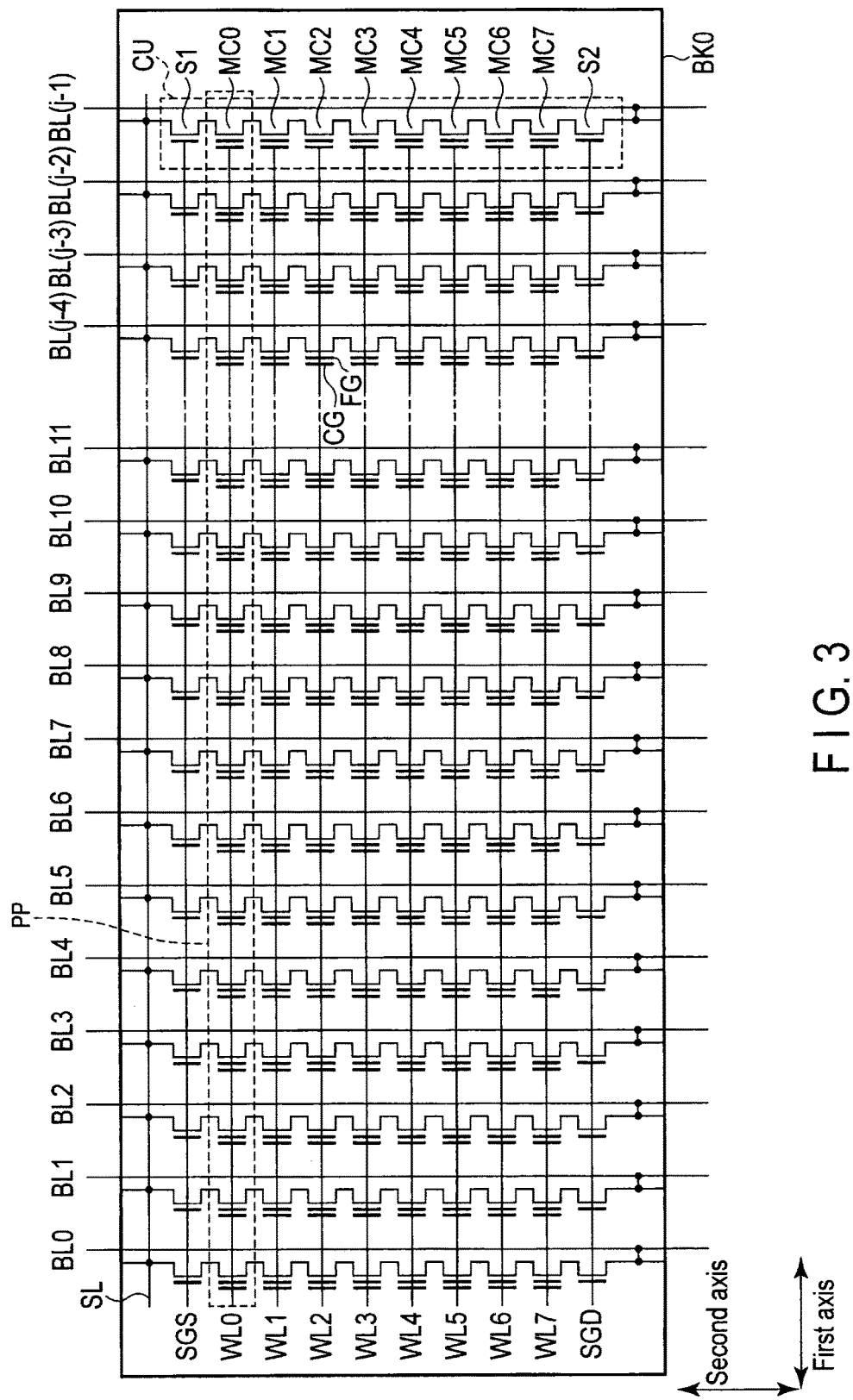
FIG. 3 is a view illustrating an exemplary block of a memory cell array.

In general, according to one embodiment, a memory system comprises a nonvolatile semiconductor memory and a memory controller controlling the nonvolatile semiconductor memory. The memory controller has a first signal generation section that generates a first signal related with a read voltage used for read operation of the nonvolatile semiconductor memory, a second signal generation section that generates a second signal that specifies the temperature coefficient used for the correction for temperature of the read voltage, and a first interface section that outputs the first signal, the second signal and a read command. The nonvolatile semiconductor memory has a word line, a memory cell array comprising memory cells connected to the word line, a second interface section that receives the first signal, the second signal and the read command, and a control section configured to generate the read voltage determined based on the first signal, to adjust the read voltage based on the temperature coefficient specified by the second signal, thereby generating the adjusted read voltage, to determine threshold voltage of each of the memory cells connected to the word line using the adjusted read voltage, and to output a result obtained by determining the threshold voltage through the second interface section to the memory controller.

1. Embodiment

FIG. 1 illustrates an exemplary memory system.

The memory system has a memory controller 100 and a nonvolatile semiconductor memory 200 controlled by the memory controller 100.

The memory controller 100 comprises a processing section 110, an interface section 120, a storage section 130, an error checking and correcting section (ECC) 140, and a bus 150 that connects these sections.

The processing section 110 comprises a first signal generation section 111 that generates a first signal that specifies the read voltage used at the time of distribution read of the nonvolatile semiconductor memory 200, and a second signal generation section 112 that generates a second signal that specifies the temperature coefficient (temperature coefficient applied to the read voltage) used for temperature correction of the read voltage used at the time of distribution read.

The interface section 120 outputs a distribution read command CMD, the first signal, and the second signal to the nonvolatile semiconductor memory 200 at the time of distribution read.

The error checking and correcting section 140 checks and corrects for errors the read data read from the nonvolatile semiconductor memory 200, for example.

The storage section 130 has a table 131. The table 131 includes read voltages, digital values (DAC values) corresponding to the read voltages, and information for choosing a temperature coefficient used for correcting the temperatures of the respective read voltages. The first signal generation section 111 and the second signal generation section 112 respectively generate the first and the second signal with reference to the table 131 in the storage section 130.

FIG. 2 illustrates an exemplary nonvolatile semiconductor memory.

The nonvolatile semiconductor memory 200 is a NAND flash memory, for example.

The nonvolatile semiconductor memory 200 comprises an input/output (I/O) controller 201, a command/signal buffer 202, an address buffer 203, a voltage controller 204, a voltage generator 205, a driver 206, a sense amplifier 207, a decoder 208, a memory cell array 209, a page buffer 210, and a temperature sensor 211.

Based on an input signal IN, the I/O controller 201 supplies to a command/signal buffer 202 the command CMD, the first signal S1, and the second signal S2, all having been received from the memory controller 100, and supplies an address to the address buffer 203. Moreover, the I/O controller 201 sends data to the page buffer 210 at the time of writing, and receives data from the page buffer 210 at the time of reading.

The command/signal buffer 202 decodes the command CMD, and outputs instructions to the voltage controller 204 in order to execute various operations (for example, reading, writing, erasing, etc.) indicated by the command. Moreover, the command/signal buffer 202 decodes the first signal S1 and the second signal S2, and outputs these to the voltage controller 204. The address buffer 203 decodes the address and outputs the address to the driver 206.

The voltage controller 204 controls the operation of access to the memory cell array 209 according to the command from the command buffer 202.

The voltage generator 205 generates the read voltage CGRV for realizing read operation based on the control signal CGRVDAC from the voltage controller 204. The driver 206 controls the operation of the sense amplifier 207, the decoder 208, and the memory cell array 209 based on the address from the address buffer 203 and the instructions from the voltage controller 204.

The memory cell array 209 comprises blocks BK0-BKm (m is a natural number of 1 or more). Each of the blocks BK0-BKm comprises physical pages.

Moreover, one physical page comprises n logical pages (n is a natural number of 2 or more). That is, the nonvolatile semiconductor memory is a multi-value memory which has a $2^n$ threshold distribution.

The temperature sensor 211 senses the temperature of the nonvolatile semiconductor memory 200, and outputs temperature information TC. It is desirable that the temperature sensor 211 be arranged near the memory cell array 209 in order to correctly detect the temperature of the memory cell array 209.

The voltage controller 204 holds a table 213 in a manner that a register keeps the information included in the table 213, for example. The table 213 includes read voltages, digital values (DAC values) separately corresponding to the read voltages, and the information for choosing temperature coefficients used for correcting temperatures induced by the read voltages. The voltage controller 204 outputs the control signal CGRVDAC for making the voltage generator 205 generate desired read voltage using the information included in the table 213 at the time of normal read and verify read. Moreover, the voltage controller 204 outputs the control signal CGRVDAC for making the voltage generator 205 generate desired read voltage based on the first signal S1 and the second signal S2 received from the memory controller 100 at the time of distribution read.

FIG. 3 illustrates one exemplary block of a memory cell array.

FIG. 3 illustrates block BK0 of FIG. 2.

Moreover, even blocks BK2, . . . individually have the same layout as the layout of block BK0, and odd blocks BK1, . . . individually have the layout in which the layout of block BK0 turns upside down.

Block BK0 comprises cell units CU arranged along a first axis. Every cell unit CU comprises a memory cell string comprising eight memory cells MC0-MC7 arranged along a second axis perpendicular to the first axis and connected in series with one another to form a current path having two opposite ends, a select transistor S1 at a source line SL side connected to one of the ends of the current path of the memory cell string, and a select transistor S2 at a bit line BL(j−1) side connected to the other end of the current path of the memory cell string.

Any memory cell MCk (k is one of 0-7) comprises a charge storage layer (for example, a floating gate electrode) FG and a control gate electrode CG.

In this example, any cell unit CU comprises eight memory cells MC0-MC7, but the number of the memory cells is not confined to this example. For example, nothing matters so long as every cell unit CU comprises at least two memory cells. It is therefore possible for every cell unit CU to comprise, for example, thirty two or fifty six memory cells.

One end of the current path of every memory cell string is connected through the corresponding select transistor S1 to the source line SL. The other end of the current path of every memory cell string is connected through the corresponding select transistor S2 to the bit line BL(j−1).

The control gate electrode CG of every one of the memory cells MC0-MC7 arranged along the second axis and constituting any one of the memory cell strings arranged along the first axis is connected to corresponding one of the word lines WL0-WL7. Furthermore, a select gate line SGS is connected in common to all the gate electrodes of select transistors S1 arranged along the first axis. Similarly, a select gate line SGD is connected in common to all the gate electrodes of select transistors S2 arranged along the first axis.

For example, j memory cells connected to the word line WLi (i is one of 0-7) constitute one physical page PP, and include n logical pages.

Here, a normal read operation and a distribution read operation will be explained.

In a normal read operation, the page data stored in the physical page PP is read into the bit lines BL0-BL(j−1) as read data by applying a read voltage to one selected word line, for example, word line WL0. The read data is amplified by a sense amplifier, and is output from the nonvolatile semiconductor memory through a page buffer to a memory controller.

The read voltage in the normal read operation is a read voltage applied to the selected word line in order to determine the threshold of a memory cell. For example, when a memory cell has four mountains in its threshold distribution, a read voltage is set at each of the three valleys defined by the four mountains in the threshold distributions.

In a distribution read operation, several kinds of read voltages are sequentially applied to a selected word line, for example. The status (the number of 0 or 1) exhibited by each of the memory cells connected to the word line is determined (counted). Thus, the threshold distribution of each of the memory cells is acquired. In other words, the threshold voltage of each of the memory cells connected to the word line is determined by sequentially applying several kinds of read voltages to the selected word line, and the determined result is counted. Therefore, the read voltage in the distribution read operation will be successively incremented for every read operation, for example.

Next, the table 131 will be explained with reference to FIG. 4 and FIG. 5.

The table 131 keeps, for example, digital values (DAC values) D0, D1, . . . , D127 corresponding to the read voltages CGRV. Moreover, the table 131 keeps the temperature coefficients applied to the read voltages CGRV. A temperature coefficient is chosen from several previously determined values (zero may be included).

A temperature coefficient is chosen from three values TCO_A, TCO_B and TCO_C, in this example. TCO_A is applied as a temperature coefficient to the read voltage CGRV corresponding to the digital value whose A-level cell flag is 1. TCO_B is applied as a temperature coefficient to the read voltage CGRV corresponding to the digital value whose B-level cell flag is 1. TCO_C is applied as a temperature coefficient to the read voltage CGRV corresponding to the digital value whose C-level cell flag is 1.

The range to which any of TCO_A, TCO_B, and TCO_C is applied can be changed by changing any of the A-, B-, and C-level cell flags, all registered in the table 131.

Moreover, any flag (indicative of any one of an A-, a B-, and a C-level cell) corresponds to a threshold distribution (indicative of any one of an A-, a B-, and a C-level) which any one of the write-in state memory cells exhibits. It should be noted that the threshold distribution of each memory cell includes an elimination state and a write-in (A-, B-, and C-level) state.

When the table illustrated in FIG. 4 is used, temperature coefficient TCO_A is applied to those read voltages that correspond to DAC values ranging from (0000000) to (1000101). The applied temperature coefficient should be changed to TCO_B from the read voltage corresponding to a DAC value (1000110), and temperature coefficient TCO_B is applied to those read voltages that correspond to DAC values ranging from (1000110) to (1100011). Furthermore, the applied temperature coefficient should be changed to TCO_C from the read voltage corresponding to a DAC value (1100100), and temperature coefficient TCO_C is applied to the read voltages that correspond to DAC values ranging from (1100100) to (1111111).

Similarly, when the table illustrated in FIG. 5 is used, the temperature coefficient will be changed from TCO_A to TCO_B after the read voltage, which corresponds to a DAC value (1010100) and to which temperature coefficient TCO_A is applied, has changed to the read voltage corresponding to a DAC value (1010101). Furthermore, the temperature coefficient will be changed from TCO_B to TCO_C after the read voltage corresponding to a DAC value (1110010) has been changed to the read voltage corresponding to a DAC value (110011).

As has been described above, the timing of changing temperature coefficients applied to read voltages is different between the table illustrated in FIG. 4 and the table illustrated in FIG. 5. The details on the difference in this change timing will be described later.

The first signal generation section in the memory controller makes reference to digital values (DAC values) and outputs as a first signal a DAC value corresponding to read voltage CGRV. The second signal generation section in a memory controller refers to the information for choosing a temperature coefficient applied to a read voltage, namely, the information on the A-level cell/B-level cell/C-level cell illustrated in FIG. 4 or FIG. 5, and then outputs a second signal for choosing any one of TCO_A, TCO_B, and TCO_C.

As has been explained above, the memory controller holds the table 131 which keeps the digital values corresponding to read voltages and the information for choosing a temperature coefficient applied to a read voltage. Therefore, the memory controller can specify a read voltage and a temperature coefficient at the time of distribution read.

Next, the table 213 will be explained with reference to FIG. 6.

The table 213 keeps read voltages CGRV (V55, V59, V85, V89, V115, V119) as digital values D55, D59, D85, D89, D115, and D119, for example.

V55 is used when performing as an internal operation normal read AR which identifies from a $2^n$ threshold distribution all memory cells that are at an A-level. V59 is used when performing as an internal operation verify read AV which verifies after the programmed operation has finished whether writing has been successfully performed to all the memory cells that are at the A-level or in much higher levels with making reference to the $2^n$ threshold distribution.

Similarly, V85 is used when performing as an internal operation normal read BR which identifies from the $2^n$ threshold distribution all memory cells that are at a B-level. V89 is used when performing as an internal operation verify read BV which verifies after the programmed operation has finished whether writing has been successfully performed to all the memory cells that are at the B-level or in much higher levels with making reference to the $2^n$ threshold distribution.

Moreover, V115 is used when performing as an internal operation normal read CR which identifies from the $2^n$ threshold distribution all memory cells that are at a C-level. V119 is used when performing as an internal operation verify read CV which verifies after the programmed operation has finished whether writing has been successfully performed to all the memory cells that are at the C-level or in much higher levels with making reference to the $2^n$ threshold distribution.

The table 213 further keeps temperature coefficients applied to the read voltages CGRV. A temperature coefficient is chosen from previously determined values (zero may be included).

A temperature coefficient is chosen from three values TCO_A, TCO_B, and TCO_C in this example. TCO_A is applied when performing normal read AR and verify read AV. TCO_B is applied when performing normal read BR and verify read BV, and TCO_C is applied when performing normal read CR and verify read CV.

In addition, as mentioned above, the information indicated in the table 213 does not need to be held in the form of a table, and may be held in a form that is mounted in a register.

FIG. 7 illustrates an example of the voltage controller 204 in the nonvolatile semiconductor memory of FIG. 2.

The voltage controller 204 comprises a select signal generation section 204a and a control signal generation section 204b.

A select signal generation section 204a generates select signals Sel_A, Sel_B, and Sel_C based on command CMD, second signal S2, and U/L signal input from the outside of the nonvolatile semiconductor memory (the memory controller), and outputs them to a control signal generation section 204b. The control signal generation section 204b generates the control signal CGRVDAC based on select signals Sel_A, Sel_B, Sel_C, and the first signal S1. The control signal CGRVDAC is input into the voltage generator 205 of FIG. 2.

A U/L signal is information indicative of whether upper page data or lower page data should be read when a memory cell stores 2 bit data. The U/L signal is generated by the address buffer 203 of FIG. 2 according to the page address specified by the memory controller, for example.

For example, the select signal generation section 204a outputs the select signal which selects BR as the read voltage and TCO_B as the temperature coefficient in order to perform a B-level read upon reception of the U/L signal (for example, 0) which indicates that lower page data should be read. Moreover, the select signal generation section 204a outputs a select signal which selects CR as the read voltage and TCO_C as the temperature coefficient after having selected AR as the read voltage and TCO_A as the temperature coefficient in order to perform a C-level read after having performed an A-level read upon reception of the U/L signal (for example, 1) which indicates that upper page data should be read.

FIG. 8 illustrates another example of the voltage controller in the nonvolatile semiconductor memory.

FIG. 8 illustrates a case in which the information (CGRVDAC_BASE) relevant to the first signal S1 is fed back when the second signal S2 indicates that a temperature coefficient should be selected based on the first signal S1. The feedback of the information (CGRVDAC_BASE) relevant to the first signal S1 makes it possible to modify select signals Sel_A, Sel_B, and SeL_C based on the fed-back information, for instance.

Figure 9:
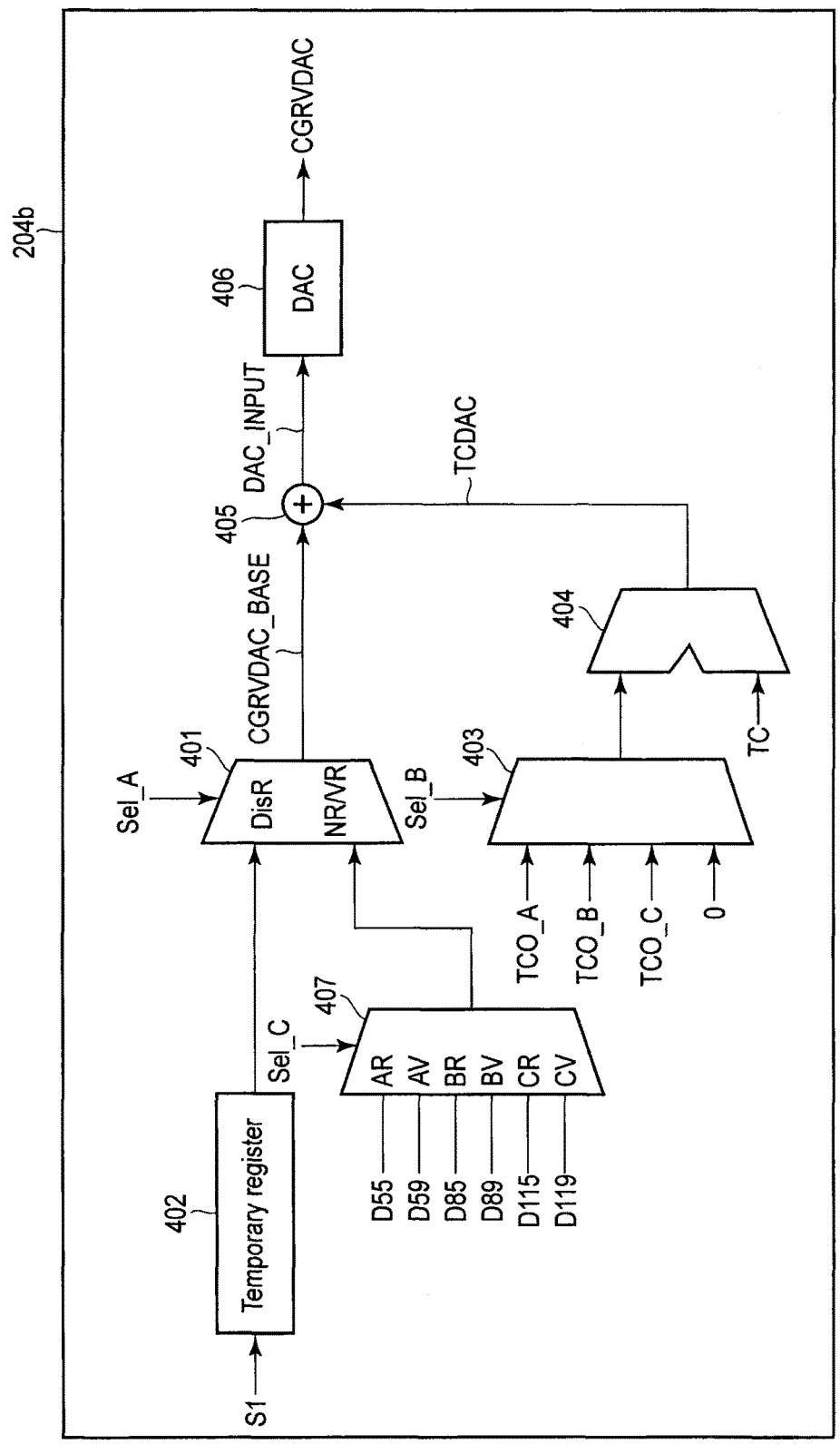
FIG. 9 is a view illustrating an exemplary control signal generation section.

FIG. 9 illustrates particulars of the control signal generation section 204b illustrated in FIG. 7.

What is necessary for making the particulars illustrated in FIG. 9 correspond to the control signal generation section 204b illustrated in FIG. 8 is just to make CGRVDAC_BASE output from the control signal generation section 204b.

The value of temporary register 402 can be directly set by the memory controller, when the nonvolatile semiconductor memory receives a command for performing distribution read.

Upon performing distribution read, the first select section 401 selects as the first signal S1 the value registered with the temporary register 402.

For example, when the select signal generation section 204a illustrated in FIG. 7 or FIG. 8 receives from the memory controller command CMD for performing distribution read (DisR), it outputs select signal Sel_A which selects the first signal S1. Accordingly, the first select section 401 selects the value of the temporary register 402 as the first signal S1.

The second select section 403 selects one of TCO_A, TCO_B, TCO_C, and zero as a temperature coefficient based on select signal Sel_B upon performing distribution read, for example. When the select signal generation section 204a illustrated in FIG. 7 or FIG. 8 receives from the memory controller the command CMD for performing distribution read (DisR), for example, it outputs select signal Sel_B which selects a temperature coefficient based on the second signal S2 input from the (memory controller which is) outside of the nonvolatile semiconductor memory. That is, when the second signal S2 indicates one of TCO_A, TCO_B, TCO_C, and zero, it outputs select signal Sel_B based on the second signal S2.

The logic section 404 generates adjustment value TCDAC based on temperature information TC of the nonvolatile semiconductor memory and a temperature coefficient selected by the second select section 403.

The adding section 405 generates control signal DAC_INPUT by adding the adjustment value TCDAC to the first signal S1 which is output signal CGRVDAC_BASE of the first select section 401.

Based on control signal DAC_INPUT, the digital analog converter 406 generates analog signal CGRVDAC which is supplied to a voltage generator.

When the select signal generation section 204a illustrated in FIG. 7 or FIG. 8 receives from the memory controller a command for performing either normal read or verify read, it outputs both select signal Sel_A and select signal Sel_C, the former causing the first select section 401 to select an output from the third select section 407, and the latter causing the third select section 407 to select a predetermined digital value.

Moreover, when the select signal generation section 204a illustrated in FIG. 7 or FIG. 8 receives from the memory controller the command for performing either normal read or verify read, it outputs select signal Sel_B for causing the second select section 403 to select one of TCO_A, TCO_B, TCO_C, and zero.

Specifically, one of the internal operations AR, AV, BR, BV, CR, and CV which the nonvolatile semiconductor memory executes, and one of the digital values D55, D59, D85, D89, D115, and D119 which is required for executing the internal operation are uniquely determined by the command CMD from the memory controller. Therefore, the select signal generation section 204a suitably outputs select signals Sel_A and Sel_C according to the internal operations AR, AV, and BR, BV, CR, and CV.

Moreover, the nonvolatile semiconductor memory is set up beforehand so that a temperature coefficient, i.e., one of TCO_A, TCO_B, TCO_C, and zero, will be uniquely determined according to the internal operations AR, AV, and BR, BV, CR, and CV. Therefore, the select signal generation section 204a suitably outputs select signal Sel_B according to the internal operations AR, AV, and BR, BV, CR, and CV.

For example, the temperature coefficient will be set as TCO_A when either internal operation AR or internal operation AV is performed. The temperature coefficient will be set as TCO_B when either internal operation BR or internal operation BV is performed. The temperature coefficient will be set as TCO_C when internal operation CR or internal operation CV is performed.

FIG. 10 and FIG. 11 individually illustrate an example in which the memory controller outputs to the nonvolatile semiconductor memory first signal S1 indicative of read voltage, a distribution read (DisR) command, and second signal S2 that specifies a temperature coefficient. Furthermore, the memory controller outputs to the nonvolatile semiconductor memory command Xi indicative of inputting an address for reading an object, address ADDRESS of the object, and command Xe for reading the object.

First signal S1 and second signal S2 are input in a different cycle in FIG. 10, whereas they are input in the same cycle in FIG. 11.

In this example, when the second signal S2 selects temperature coefficient TCO_A, temperature coefficient TCO_A is applied to the read voltage used for read operation of the memory cell specified by address ADDRESS. Moreover, when the second signal S2 selects temperature coefficient TCO_B, temperature coefficient TCO_B is applied to the read voltage used for read operation of the memory cell specified by address ADDRESS. When the second signal S2 selects temperature coefficient TCO_C, temperature coefficient TCO_C is applied to the read voltage used for read operation of the memory cell specified by address ADDRESS.

Moreover, it does not matter if second signal S2 indicates that a temperature coefficient should be selected based on first signal S1. For example, let us consider a case where second signal S2 indicates that a temperature coefficient should be selected based on the information (CGRV-DAC_BASE) relevant to first signal S1 illustrated in FIG. 8.

Under the circumstances, when the information (CGRV-DAC_BASE) relevant to first signal S1 illustrated in FIG. 8 is 7 bit data, it is possible to select a temperature coefficient based on top 2 bits. That is, when top 2 bits are expressed as 00, TCO_A is selected as a temperature coefficient. When top 2 bits are expressed as 01, TCO_B may be selected as a temperature coefficient. When top 2 bits are expressed as 10, TCO_C may be selected as a temperature coefficient. When top 2 bits are expressed as 11, zero may be selected as a temperature coefficient.

2. Timing for Changing Temperature Coefficients

It is possible to change the timing for changing temperature coefficients using table 131 as mentioned above.

Figure 12:
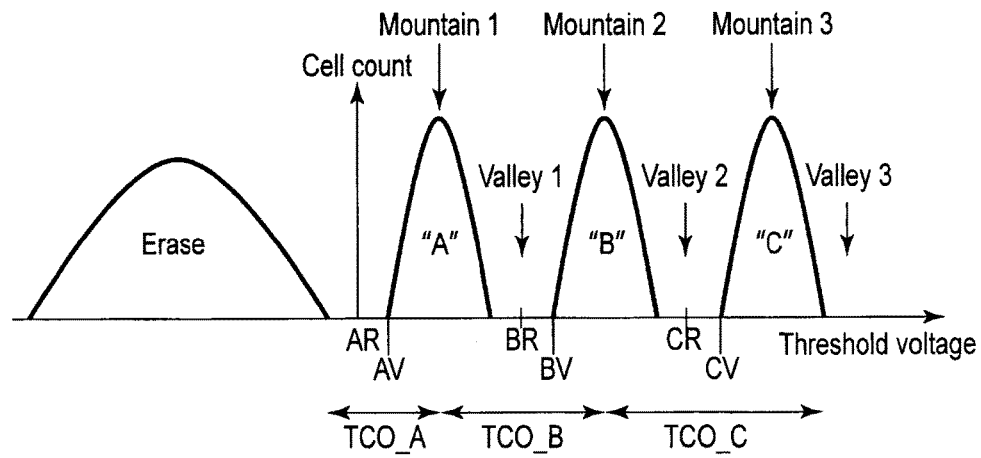
FIG. 12 is a view illustrating an example of changing temperature coefficients using the mountain of $2^n$ threshold distribution.

When confirming where Valley 1, Valley 2, and Valley 3 are located in the $2^n$ threshold distribution by means of the distribution read, it is desirable to change temperature coefficients at every interval between any two adjacent valleys in the $2^n$ threshold distribution, for instance, at each of Mountain 1, Mountain 2, and Mountain 3 in the $2^n$ threshold distribution, as illustrated in FIG. 12. Therefore, it is desirable to use the table illustrated in FIG. 4.

Figure 13:
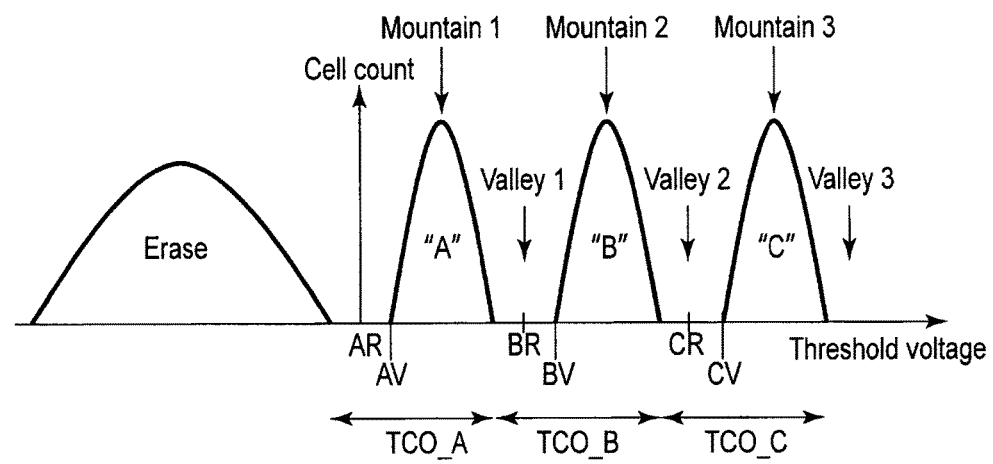
FIG. 13 is a view illustrating an example of changing temperature coefficients using the valley of a $2^n$ threshold distribution.

Moreover, when confirming where Mountain 1, Mountain 2, and Mountain 3 are located in the $2^n$ threshold distribution by means of the distribution read (when confirming an extent of the width or range of the $2^n$ threshold distribution), it is desirable to change temperature coefficients at every interval between any two adjacent mountains in the $2^n$ threshold distribution, for instance, at each of Valley 1, Valley 2, and Valley 3 in the $2^n$ threshold distribution, as illustrated in FIG. 13. Therefore, it is desirable to use the table illustrated in FIG. 5.

This is because a discontinuous point occurs in the threshold distribution every time temperature coefficient changes. It is undesirable that the position whose $2^n$ threshold distribution should be confirmed has a discontinuous point. Therefore, a temperature coefficient is changed on the point which is fully distant from the position whose $2^n$ threshold distribution should be confirmed.

3. Relation Between Distribution Read and Error Correction

The nonvolatile semiconductor memory in the above embodiment performs distribution read according to the command from the memory controller.

Distribution read is the operation for confirming the status of $2^n$ threshold distribution (the shape of a mountain or a valley, etc.) in a multi-value memory which has a $2^n$ threshold distribution (n is a natural number of two or more). Distribution read will be performed when error data is read due to a long-term data hold or a disturbance and when an error checking and correcting executed by the error checking and correcting section (ECC) 140 illustrated in FIG. 1 fails, for example.

Then, the $2^n$ threshold distribution is examined for the shape of a mountain or a valley based on the result of distribution read. After that the read voltage for normal read is adjusted to be located at an optimal position (for example, at a valley in the $2^n$ threshold distribution), thereby allowing the error checking and correcting section 140 illustrated in FIG. 1 to perform a further error checking and correcting.

Thus, in order to allow the error checking and correcting section 140 illustrated in FIG. 1 to continuously correct an error, distribution read must be performed correctly.

FIG. 14 illustrates a case (of a comparative example) where only one temperature coefficient is applied to all the read voltages in order to confirm the $2^n$ threshold distribution when executing distribution read and a case (of the present embodiment) where different temperature coefficients are separately applied to the read voltages in order to confirm the $2^n$ threshold distribution when executing distribution read.

In the comparative example in which temperature coefficient TCO_A is solely used, neither the threshold distribution of a B-level memory cell nor the threshold distribution of a C-level memory cell can be correctly detected, for example. Therefore, a discrepancy may arise, as illustrated in FIG. 15, between the actual $2^n$ threshold distribution (solid line) and the $2^n$ threshold distribution detected by distribution read (dashed line), for example.

Therefore, in the comparative example illustrated in FIG. 14, distribution read is not performed correctly. For example, the read voltage which specifies a B-level memory cell will be set as position BR'-new of an incorrect valley, and the read voltage which specifies a C-level memory cell will be set as position CR'-new of an incorrect valley.

In this case, an error emergence amount increases and the error checking and correcting executed by the error checking and correcting section 140 illustrated in FIG. 1 becomes impossible.

In contrast, in the embodiment to which three temperature coefficients TCO_A, TCO_B, and TCO_C are applied, the $2^n$ threshold distribution detected by distribution read (embodiment illustrated in FIG. 14) and the $2^n$ actual threshold distribution (solid line illustrated in FIG. 15) will be substantially the same.

Therefore, in the embodiment of FIG. 14, the read voltage which specifies the B-level memory cell is set as position BR-new of a correct valley. The read voltage which specifies the A-level memory cell or the read voltage which specifies the C-level memory cell will also be set to position AR-new of a correct valley or CR-new of a correct valley.

Therefore, the error data emergence amount can be suppressed in the embodiment. Accordingly, the error checking and correcting section 140 illustrated in FIG. 1 can execute error checking and correcting as before.

4. Exemplary Application

Now, a data storage device in the above embodiment and a computer system comprising such a data storage device will be explained below.

Figure 16:
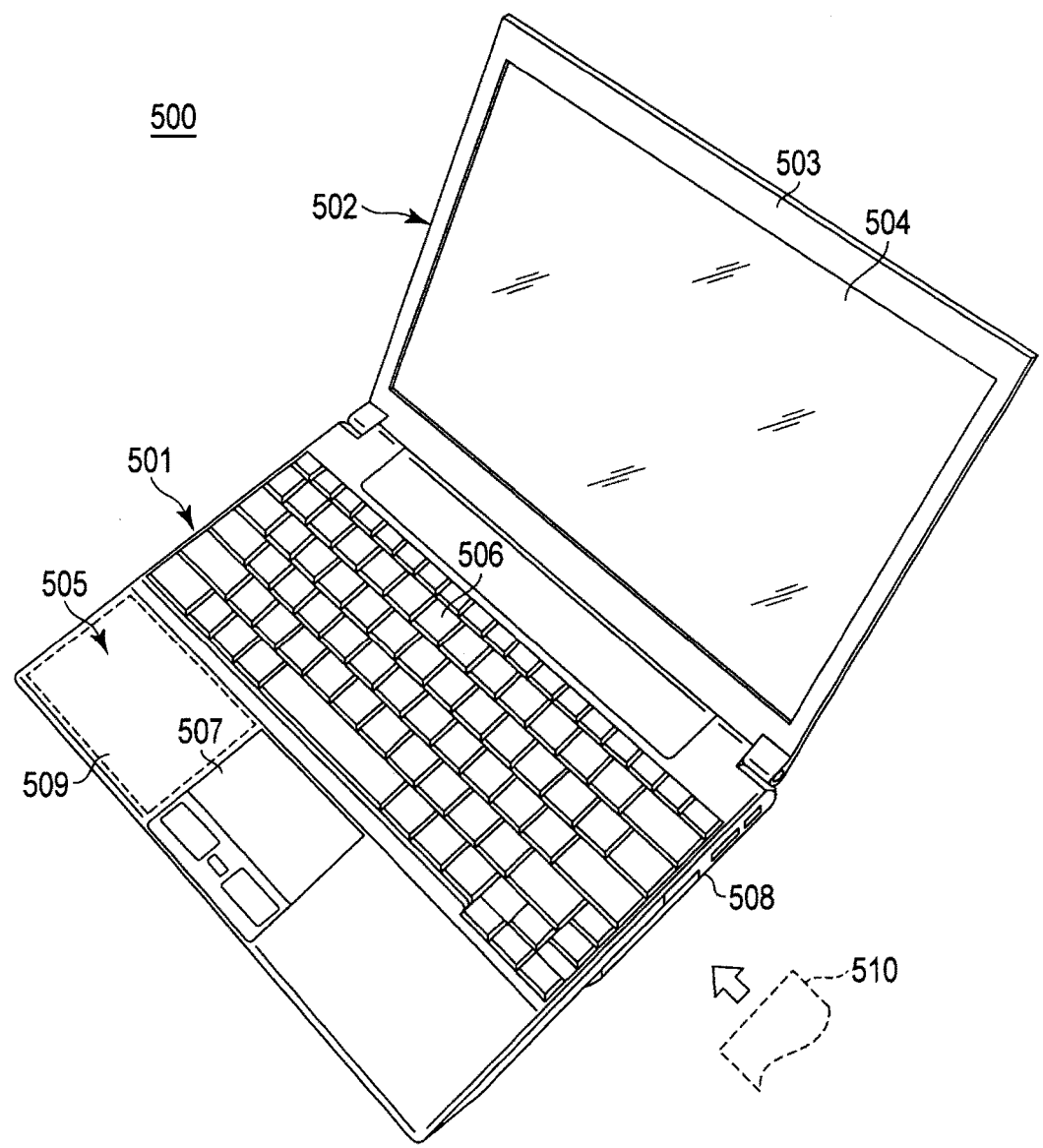
FIG. 16 is a view exemplarily illustrating an application to a portable computer.

FIG. 16 illustrates an exemplary portable computer which incorporates a data storage device.

The portable computer 500 comprises a main section 501 and a display unit 502. The display unit 502 comprises a display housing 503 and a display 504 accommodated in the display housing 503.

The main section 501 comprises a case 505, a keyboard 506, and a touchpad 507 that is a pointing device. The case 505 comprises a main circuit board, an optical disk device (ODD) unit, a card slot 508, a data storage device 509, etc.

The card slot 508 is formed in the side of the case 505. The user can insert an additional device 510 into the card slot 508 from the exterior of the case 505.

The data storage device 509 is a solid state drive (SSD), for example. An SSD may be used in a state where it is installed in the portable computer 500 as a replacement of a hard disk drive (HDD), or may be used as an additional device 510. The data storage device 509 comprises a memory controller in the embodiment and a nonvolatile semiconductor memory controlled by the memory controller.

Figure 17:
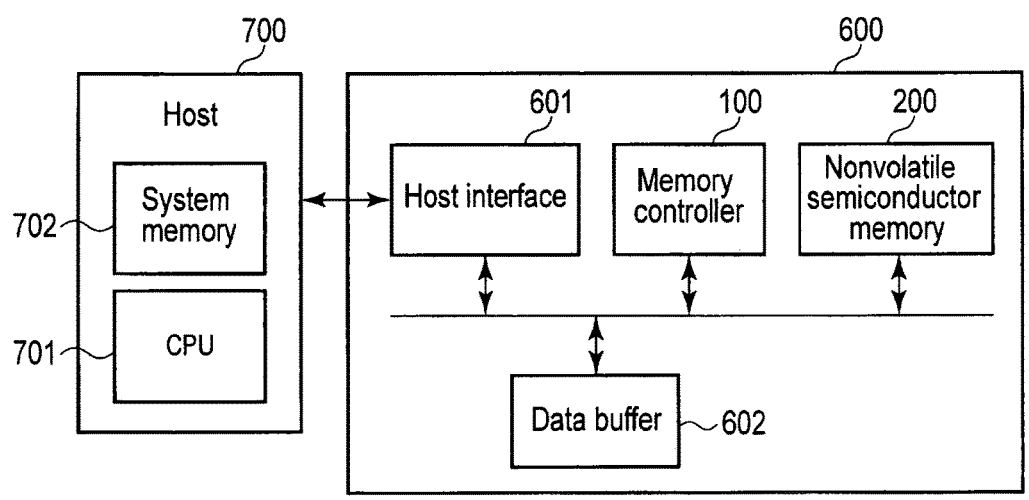
FIG. 17 is a view exemplarily illustrating an application to a data storage device.

FIG. 17 illustrates an exemplary data storage device.

The data storage device 600 is an SSD, for example, and comprises a host interface 601, the memory controller 100, the nonvolatile semiconductor memory 200, and a data buffer 602.

The host interface 601 functions as an interface between a host 700 and the data storage device 600. The host 700 has a CPU 701 and a system memory 702.

The nonvolatile semiconductor memory 200 is a NAND flash memory, for example. The data buffer 602 is, for example, a DRAM, an MRAM, or something else. Namely, the data buffer 602 should just be a random access memory faster than the nonvolatile semiconductor memory 200 used as a storage memory.

The memory controller 100 controls the nonvolatile semiconductor memory 200 for the purpose of reading, writing or erasing data.

The memory controller 100 and the nonvolatile semiconductor memory 200 in the present application respectively correspond to the memory controller 100 and the nonvolatile semiconductor memory 200 in the aforementioned embodiment.

5. Conclusion

As described above, the embodiment makes it possible to make the threshold distribution obtained by distribution read to coincide with the actual threshold distribution obtained by normal read/verify read.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

What is claimed is:

1. A memory system comprising a nonvolatile semiconductor memory and a memory controller controlling the nonvolatile semiconductor memory, the memory controller comprising:
a first signal generation section configured to generate a first signal related with a read voltage used for read operation of the nonvolatile semiconductor memory;
a second signal generation section configured to generate a second signal for specifying a temperature coefficient used for temperature correction of the read voltage; and
a first interface section configured to output the first signal, the second signal, and a read command; and the nonvolatile semiconductor memory comprising:
a word line;
a memory cell array comprising memory cells connected to the word line;
a second interface section configured to receive the first signal, the second signal, and the read command; and
a control section configured to generate the read voltage determined based on the first signal, to adjust the read voltage based on the temperature coefficient specified by the second signal, thereby generating the adjusted read voltage, to read data of the memory cells connected to the word line using the adjusted read voltage, and to output the read data through the second interface section to the memory controller, wherein each of the memory cells is capable of storing n bits (n is a natural number of two or more), and the memory controller is configured to:
set the first signal to a first value, and an i-th value (i is a natural number of two or more) in series, and set the second signal to a first value, and an i-th value in series, where the k-th value of the first signal corresponds to the k-th value of the second signal, the k-th value is one of the first to i-th values, and the temperature coefficient specified by the k-th value of the second signal is different from the temperature coefficient specified by the (k+1)-th value of the second signal when the read voltage specified by the k-th value of the first signal is provided in a first range different from the second range in which the read voltage specified by the (k+1)-th value of the first signal is provided, and
determine a $2^n$ threshold distribution of the memory cells based on the data obtained from the nonvolatile semiconductor memory by the first to i-th values of the first and second signals.

2. The memory system of claim 1, wherein the memory controller further comprises a storage section configured to store a digital value corresponding to the read voltage for every read voltage and the first signal generation section generates the digital value as the first signal.

3. The memory system of claim 2, wherein the storage section stores information specifying a temperature coefficient for every read voltage, and the second signal generation section generates the second signal based on the information specifying the temperature coefficient.

4. The memory system of claim 1, wherein the control section outputs for every read voltage the read data through the second interface section to the memory controller.

5. The memory system of claim 1, wherein the nonvolatile semiconductor memory is a multi-value memory having a $2^n$ threshold distribution (n is a natural number of two or more), and the temperature coefficient specified by the second signal is changed before and behind the read voltage corresponding to a mountain of the $2^n$ threshold distribution.

6. The memory system of claim 1, wherein the nonvolatile semiconductor memory is a multi-value memory having a $2^n$ threshold distribution (n is a natural number of two or more), and the temperature coefficient specified by the second signal is changed before and behind the read voltage corresponding to a valley of the $2^n$ threshold distribution.

7. The memory system of claim 1, wherein the second interface section receives an address along with the first signal, the second signal, and the read command, and the control section outputs through the second interface section to the memory controller the read data specified by the address.

8. A memory system comprising a nonvolatile semiconductor memory and a memory controller controlling the nonvolatile semiconductor memory, the memory controller comprising:
a first signal generation section configured to generate a first signal specifying a read voltage used for read operation of the nonvolatile semiconductor memory and a temperature coefficient used for the correction for temperature of the read voltage;
a second signal generation section configured to generate a second signal for giving an instruction to subject the read voltage specified by the first signal to correction for temperature based on the temperature coefficient; and a first interface section configured to output the first signal, the second signal, and a read command; and the nonvolatile semiconductor memory comprising:

a word line;

a memory cell array comprising memory cells connected to the word line;

a second interface section configured to receive the first signal, the second signal, and the read command; and a control section configured to generate the read voltage determined based on the first signal, to adjust the read voltage based on the temperature coefficient specified by the first signal, thereby generating the adjusted read voltage, to read data of the memory cells connected to the word line using the adjusted read voltage, and to output the read data through the second interface section to the memory controller, wherein each of the memory cells is capable of storing n bits (n is a natural number of two or more), and the memory controller is configured to:

set the first signal to a first value, . . . and an i-th value (i is a natural number of two or more) in series, and set the second signal to a first value, . . . and an i-th value in series, where the k-th value of the first signal corresponds to the k-th value of the second signal, the k-th value is one of the first to i-th values, and the temperature coefficient specified by the k-th value of the second signal is different from the temperature coefficient specified by the (k+1)-th value of the second signal when the read voltage specified by the k-th value of the first signal is provided in a first range different from a second range in which the read voltage specified by the (k+1)-th value of the first signal is provided, and determine a $2^n$ threshold distribution of the memory cells based on the data obtained from the nonvolatile semiconductor memory by the first to i-th values of the first and second signals.

9. The memory system of claim 8, wherein the nonvolatile semiconductor memory is a multi-value memory having a $2^n$ threshold distribution (n is a natural number of two or more), and the temperature coefficient specified by the second signal is changed before and behind the read voltage corresponding to a mountain of the $2^n$ threshold distribution.

10. The memory system of claim 8, wherein the nonvolatile semiconductor memory is a multi-value memory having a $2^n$ threshold distribution (n is a natural number of two or more), and the temperature coefficient specified by the second signal is changed before and behind the read voltage corresponding to a valley of the $2^n$ threshold distribution.

* * * * *